(12) United States Patent
Cook et al.

(10) Patent No.: US 11,854,933 B2
(45) Date of Patent: Dec. 26, 2023

(54) THERMALLY CONDUCTIVE WAFER LAYER

(71) Applicant: Texas Instruments Incorporated, Dallas, TX (US)

(72) Inventors: Benjamin Stassen Cook, Santa Clara, CA (US); Nazila Dadvand, Santa Clara, CA (US); Archana Venugopal, Mountain View, CA (US); Daniel Lee Revier, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/138,541

(22) Filed: Dec. 30, 2020

(65) Prior Publication Data
US 2022/0208640 A1  Jun. 30, 2022

(51) Int. Cl.
*H01L 23/373* (2006.01)
*H01L 23/532* (2006.01)
*H01L 21/683* (2006.01)
*H01L 21/3205* (2006.01)
*H01L 21/78* (2006.01)

(52) U.S. Cl.
CPC ...... *H01L 23/373* (2013.01); *H01L 21/32051* (2013.01); *H01L 21/6835* (2013.01); *H01L 21/78* (2013.01); *H01L 23/53209* (2013.01)

(58) Field of Classification Search
CPC ............ H01L 23/373; H01L 21/32051; H01L 21/6835; H01L 21/78; H01L 23/53209
USPC ...................................................... 438/460
See application file for complete search history.

(56) References Cited

U.S. PATENT DOCUMENTS

| 8,426,309 | B2* | 4/2013 | Ward ................. H01L 29/1606 977/734 |
| 8,895,372 | B2* | 11/2014 | Guo .................... H01L 27/0688 438/149 |
| 9,102,118 | B2* | 8/2015 | Afzali-Ardakani ........................ H01L 21/324 |
| 9,548,256 | B2* | 1/2017 | Uehling ............... H01L 23/373 |
| 9,562,292 | B2* | 2/2017 | Esposito ............... C25B 11/051 |
| 9,618,474 | B2* | 4/2017 | van Rooyen ...... G01N 27/4148 |
| 11,585,796 | B2* | 2/2023 | Jang ........................ B32B 38/10 |
| 2010/0244241 | A1 | 9/2010 | Marimuthu et al. |
| 2012/0141799 | A1* | 6/2012 | Kub ...................... H01L 31/072 977/734 |
| 2014/0054802 | A1 | 2/2014 | Shim et al. |
| 2015/0097261 | A1* | 4/2015 | Harris ............... H01L 23/53276 257/750 |

(Continued)

FOREIGN PATENT DOCUMENTS

WO  2013059457 A1  4/2013

OTHER PUBLICATIONS

Search Report for PCT Application No. PCT/US2021/065266, international search report dated Apr. 21, 2022, 1 page.

*Primary Examiner* — Vu A Vu
(74) *Attorney, Agent, or Firm* — Ming Wai Choy; Frank D. Cimino

(57) ABSTRACT

In described examples, a semiconductor wafer with a thermally conductive surface layer comprises a bulk semiconductor layer having a first surface and a second surface, circuitry on the first surface, a metallic layer attached to the first surface or the second surface, and a graphene layer attached to the metallic layer. The first surface opposes the second surface. The metallic layer comprises a transition metal.

17 Claims, 8 Drawing Sheets

(56) References Cited

U.S. PATENT DOCUMENTS

| | | | |
|---|---|---|---|
| 2016/0194205 A1* | 7/2016 | Varshney | H01L 21/02425 |
| | | | 427/314 |
| 2017/0309549 A1* | 10/2017 | Wachtler | H01L 23/49541 |
| 2018/0151464 A1* | 5/2018 | Cook | H01L 23/528 |
| 2019/0058155 A1* | 2/2019 | Fleissner | H10K 50/805 |
| 2020/0266061 A1* | 8/2020 | Robinson | B32B 15/20 |
| 2021/0292921 A1* | 9/2021 | Kofuji | C25B 11/071 |

* cited by examiner

THERMALLY CONDUCTIVE WAFER LAYER

BACKGROUND

This relates generally to semiconductor device fabrication, and more particularly to thermally conductive coatings for substrates.

FIG. 1 (prior art) shows a side view of an example of a drop-on-demand inkjet printer 100 used to deposit material on a surface 102. As shown in FIG. 1, the drop-on-demand inkjet printer 100 comprises a nozzle 104 which emits material supplied by a reservoir 106. An actuator (not shown) causes material to be emitted from the nozzle 104, at specified times (on demand), as liquid droplets 108. The droplets 108 impact and are adsorbed by the surface 102, forming liquid beads 110 that are held together by surface tension. The timing of droplets 108 being ejected from the nozzle 104 as the inkjet printer 100 moves over the surface 102 determines the resulting pattern formed.

Other inkjet printer configurations are also available. Continuous inkjet printers (not shown) can also be used for selective deposition of material onto a surface. Continuous inkjet printers use a catcher located between the inkjet nozzle and the substrate surface. The catcher catches droplet material and returns it to the reservoir when the catcher is not deflected, enabling the inkjet printer to continuously form and release droplets. Deposition occurs when the catcher is deflected away from interposition between the inkjet nozzle and the substrate surface, allowing droplets to reach the substrate surface. Various types of droplet deposition actuation can also be used, such as thermal actuation, piezoelectric actuation, electrodynamic actuation, and acoustic actuation inkjet printers.

Inkjet printers as used for deposition of semiconductor device-related materials, and as the noun "inkjet printer" is used herein, are not the inkjet printers used in business offices to print legible documents and images. Instead, "inkjet printer" as used herein refers to mechanisms for deposition of volumes of liquids ("inks") onto a semiconductor wafer surface, usually on picoliter or femtoliter scales, wherein the so-called "inks" contain semiconductor processing-related nanoparticles and/or precursors in suspension. The ink can then be dried and the suspended materials annealed to form permanent structures on the surface onto which the ink was deposited. Unwanted constituents of liquid and other delivery media used to deliver the nanoparticles from the inkjet printer 100 to the surface 102 are volatilized away from the wafer surface by the annealing or sintering process, leaving behind desired deposition material on the surface 102. The term "inkjet printer" is used because a business office inkjet printer, and an inkjet printer as described herein, have some analogous functions.

Inkjet printing as described herein is a non-contact, additive, fabrication and patterning process. ("Non-contact" refers to the lack of contact between the deposition apparatus—the inkjet printer—and the substrate surface.) Materials are directly deposited in a specified pattern—which can correspond to a traditionally-patterned deposition on a portion of a surface or a blanket deposition across an entire surface—in a layer-by-layer fashion, generally without using masks or stencils. Once an ink is deposited, the ink is dried and annealed or sintered to form the desired layer. Inkjet printing is useful to pattern various materials onto a surface, including conductors, dielectrics, ceramics, oxides, and semiconductors, by including such materials in respective inks.

FIG. 2 (prior art) shows an example view 200 of a wafer 202. Generally, semiconductor devices are fabricated on one surface of the wafer 202, referred to as a "front" surface 204 herein. The surface opposing the "front" surface is referred to as the "back" surface 206 or "back side" 206 herein. A back side metal layer 208 is fabricated on the back surface 206 to enhance thermal conduction. The metal layer 208 usually includes copper, though other highly thermally conductive metals can also be used.

High localized power consumption in a device can generate significant localized heat, which can warp the substrate on which the device is built, or melt or cause destructive chemical reactions in device components. The conductive metal layer 208 spreads heat across the span of the wafer 202, delocalizing elevated temperatures and facilitating heat dissipation, such as via an attached heat sink.

FIG. 3 (prior art) shows an example process 300 for fabricating a back side metal layer 208 on a back surface 206 of the FIG. 2 wafer 202 (or other substrate). In step 302, the front surface 204 of the wafer 202 is patterned, so that pattern material 304 such as conductive metal or polysilicon fills trenches 306 created using etch processes. Etch processes can include, for example, photoresist spin on, optical exposure of the photoresist, development of the photoresist to remove exposed or non-exposed portions of the photoresist (depending on whether a positive or negative photoresist is used), and etching to produce trenches 306. In step 308, adhesive 310 is applied to cover the front surface 204 of the wafer 202. In step 312, a glass carrier 314, which is useful as a safe handle for grabbing and manipulating the wafer 202, is adhered to the adhesive 310. In step 316, double-sided grinding tape 318 is adhered to the glass carrier 314. In step 320, the wafer 202 is flipped over using the glass carrier 314, and the grinding tape 318 is stuck on to a stable surface (not shown). A grinder 322 is prepared to reduce the thickness of the wafer 202, for example, from 680 to 700 microns thick down to 50 microns thick. In step 324, the wafer's 202 thickness is reduced by the grinder 322. In step 326, the wafer 202, adhesive 310 and glass carrier 314 are removed from the grinding tape 318 and the stable surface.

In step 327, a TiW (titanium-tungsten alloy) layer 328 is deposited on the back surface 204 of the wafer 202, and a copper layer 330 is deposited on the TiW layer 328. In step 332, a layer of photoresist 334 is spun onto the wafer 202 over the copper layer 330. The layer of photoresist 334 is then patterned (for example, using optical exposure and development) so that regions 336 of the photoresist 334 corresponding to scribe lines are bare of photoresist 334. The scribe line regions 336 are locations between dies where it is safe to cut the wafer 202 into separate dies without damaging circuits. In step 338, the back side 204 of the wafer 202 is etched, so that portions of the TiW layer 328 and the copper layer 330 corresponding to the regions 336 are removed. In steps 340 and 342, the back side 204 of the wafer 202 is further etched to facilitate subsequent dicing (die separation).

In step 344, double-sided dicing tape 346 is adhered to the photoresist layer 334, and used to hold the wafer 202 in place on a stable surface. In step 348, the glass carrier 314 is removed, for example, using laser debonding. In step 350, dicing is performed along the scribe lines to cut the wafer 202 into separate dies.

SUMMARY

In described examples, a semiconductor wafer with a thermally conductive surface layer comprises a bulk semiconductor layer having a first surface and a second surface, circuitry on the first surface, a metallic layer attached to the first surface or the second surface, and a graphene layer attached to the metallic layer. The first surface opposes the second surface. The metallic layer comprises a transition metal.

DETAILED DESCRIPTION

Figure 4A:
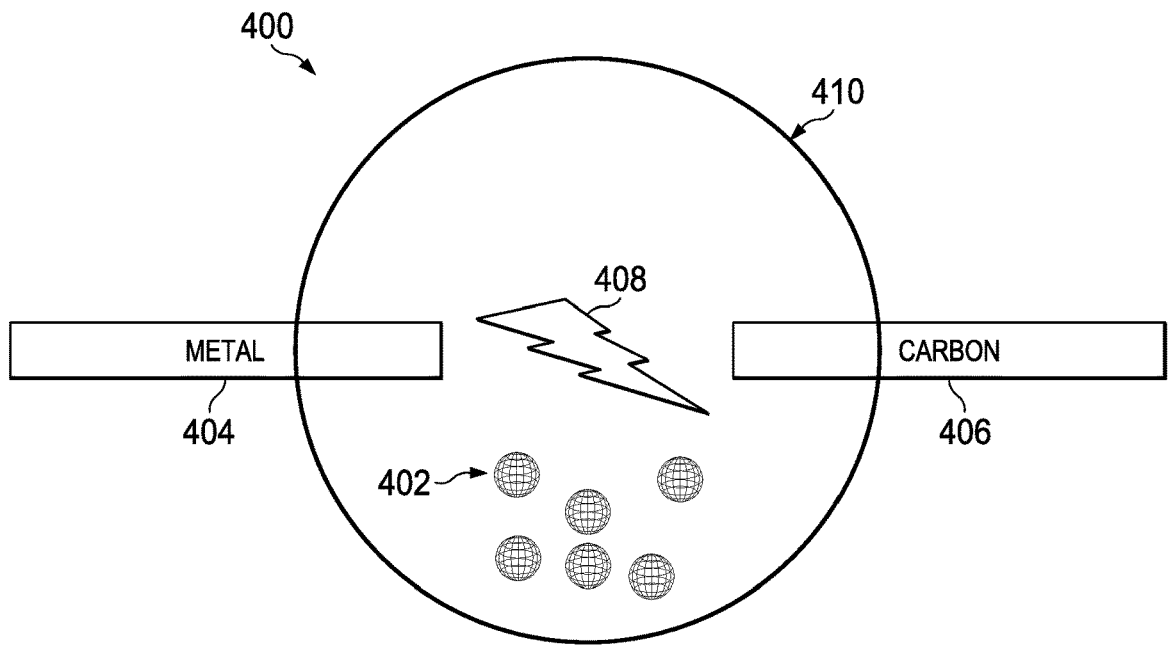
FIG. 4A shows an illustration of an example process for fabricating metallic nanoparticles.
Figure 5A:
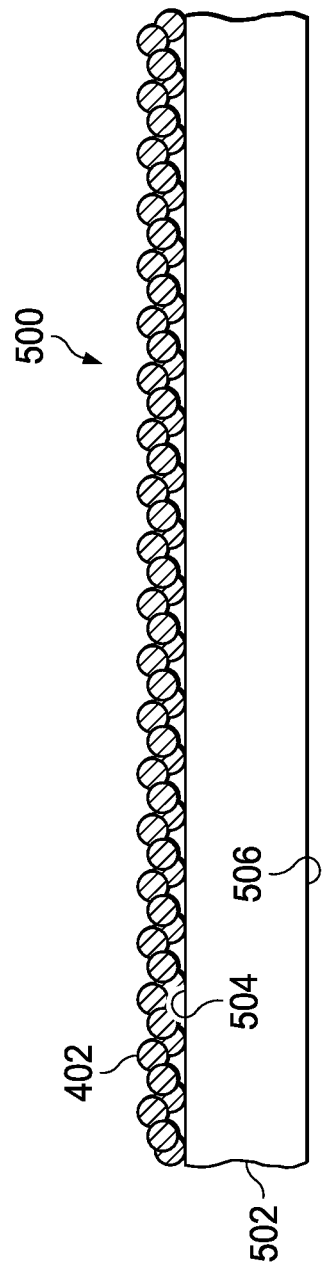
FIG. 5A shows an example view of a wafer with a layer of metallic nanoparticles, deposited in droplets on the wafer's back side, including metallic nanoparticles embedded with particles of various carbon species.
Figure 5B:
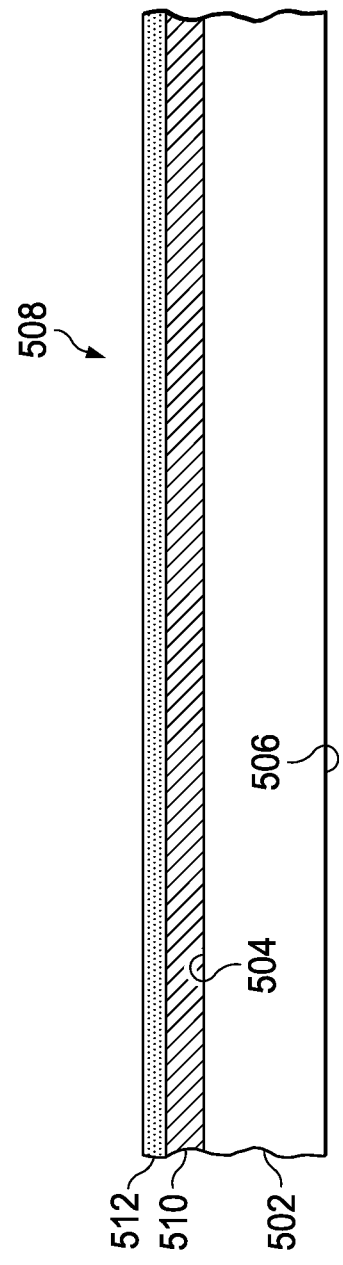
FIG. 5B shows an example view of a wafer after sintering of the layer of metallic nanoparticles to form a thermally conductive back side layer.

FIG. 4A shows an illustration of an example process 400 for fabricating metallic nanoparticles 402. By introduction, some metallic nanoparticles 402 are embedded with carbon specie particles. Such metal-carbon nanoparticles, as further described with respect to FIGS. 5A and 5B, are useful to fabricate a thermally conductive layer on the back side 504 of a semiconductor wafer 502. Graphene also may provide a favorably high thermal conductivity, which is usually measured in W/mK (Watts per meters-Kelvin). While amorphous carbon has a thermal conductivity of approximately 1.7 W/mK, and pure copper has a thermal conductivity of approximately 401 W/mK, graphene has a thermal conductivity of 2000 to 2500 W/mK.

FIG. 4A shows that a transition metal 404 and solid carbon 406 (for example, an amorphous or graphitic carbon rod) are vaporized by application of high power electric current 408 in an arc reactor 410 to form the metallic nanoparticles 402. Particularly, the transition metals, such as silver, nickel, ruthenium, cobalt, molybdenum, and iridium, generally have hexagonal surface structures in solid form. (The metal constituent is selected with consideration for its reactivity. Too reactive a metal can result in structural instability in the finished product, related to changes in microstructure due to phase transformation.) Further, carbon which nucleates on a hexagonal-structure transition metal is likely to grow with a hexagonal structure to form graphene. Accordingly, as the metal and carbon cool, metallic nanoparticles 402 form, including metallic nanoparticles 402 embedded with carbon particles. Metallic nanoparticles 402 produced by the process 400 of FIG. 4A are generally between 4 and 150 nm in diameter. Generally, smaller particle sizes correspond to increased thermal conductivity due to higher surface area compared to larger particle sizes. Design of experiments is useful to calibrate an arc tool to optimize particle production processes by optimizing parameters such as vaporization energy, chamber size and shape, reactant shape and content, and cooling rate. Some metallic nanoparticles 402 form without embedded carbon particles, while some metallic nanoparticles 402 form with multiple carbon particles. Various carbon species may be embedded in the metallic nanoparticles 402 at this stage. However, a sintering step (which is part of the process for depositing a back side 504 thermally conductive layer on a wafer 502, described with respect to FIGS. 5A and 5B) results in carbon rising from the metal and restructuring, regardless of the carbon's initial specie, to form graphenic carbon.

Figure 4B:
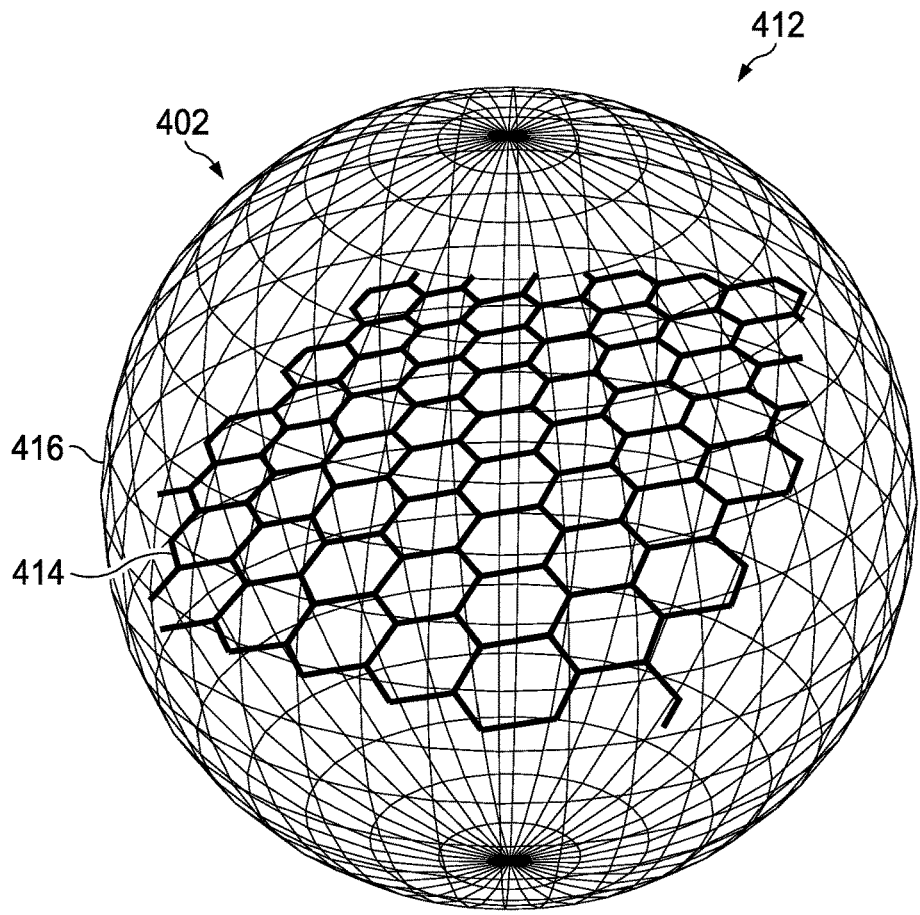
FIG. 4B shows an example illustration of a metallic nanoparticle.

FIG. 4B shows an example illustration 412 of a metallic nanoparticle 402. The nanoparticle 402 comprises metal 416 and a graphene platelet 414. Graphene platelets are single-layer or multi-layer portions of a two-dimensional graphitic sheet, and have a hexagonal lattice structure.

FIG. 5A shows an example view 500 of a wafer 502 with a layer of metallic nanoparticles 402, deposited in droplets on the wafer's 502 back side 504, including metallic nanoparticles 402 embedded with particles of various carbon species. Deposition is performed after circuits (see pattern material 608, FIG. 6) are fabricated on a front side 506 (a front surface) of the wafer 502. Circuits can include electrically functional structures attached relative to (fabricated in or on) the front side 506 of the wafer 502. Deposition of metallic nanoparticles 402 is performed on the back side 504 of the wafer 502, which accordingly is on the opposite side of the bulk of the wafer 502 from the front of the wafer 502 and the circuits. As used herein, deposition on a surface of the wafer means either depositing directly on the surface of the wafer, or depositing on a surface of a material which is attached relative and proximate to the surface of the wafer.

Figure 1:
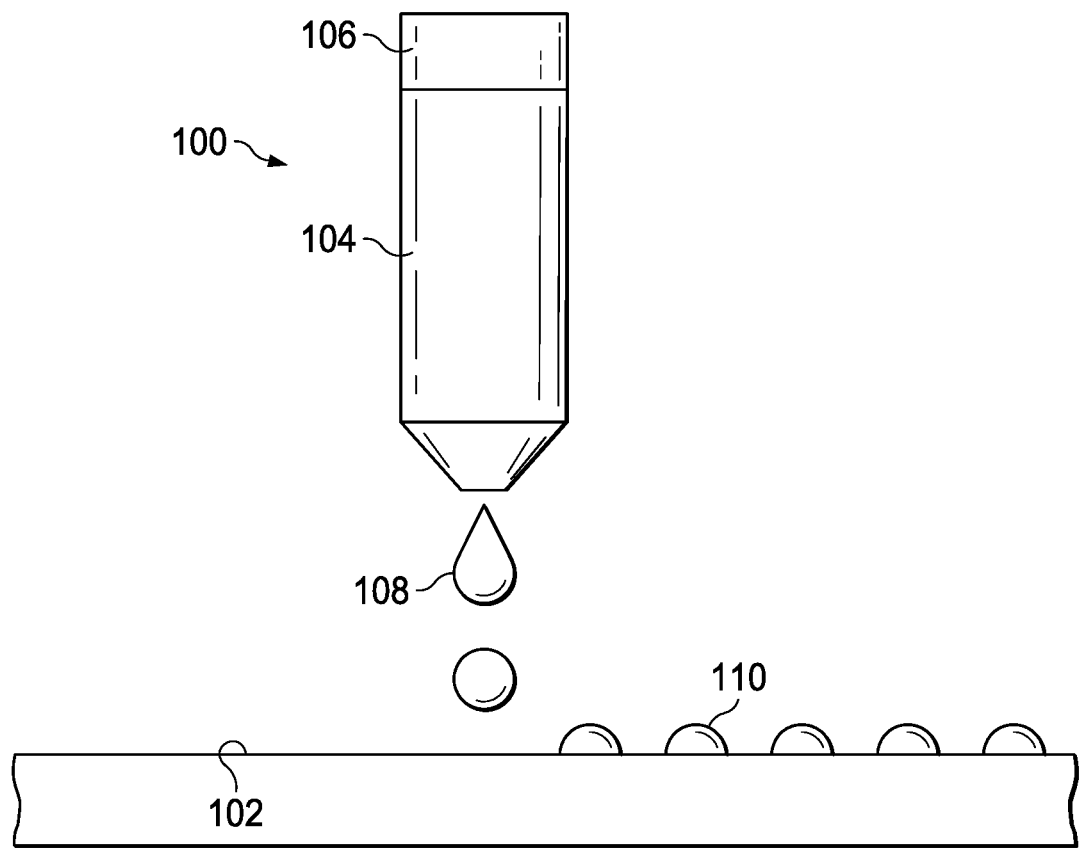
FIG. 1 (prior art) shows a side view of an example of a drop-on-demand inkjet printer used to deposit material on a surface.
Figure 2:
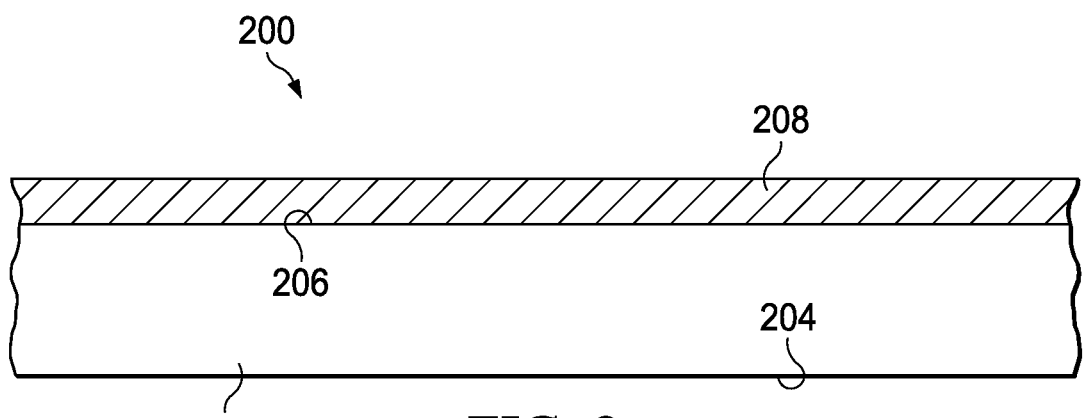
FIG. 2 (prior art) shows a view of a back side metal layer fabricated on a wafer back surface to enhance thermal conduction.

Deposition is usefully performed by, for example, an inkjet printer 100 as described with respect to FIG. 1, with the nanoparticles 402 dissolved or suspended in ink so that the metallic nanoparticles 402 do not clump. Nanoparticles 402 can be deposited non-uniformly. Droplets used for deposition can have an upper diameter limit of, for example, 200 nm to 1 micron. Droplets of diameter equal to or less than 200 nm can use, for example, a pH of 4 to 9, with a viscosity of 8 to 20 cubic Pascal, and a surface tension of 28 to 32 mN/m (milli-Newtons per meter). Multiple layers of droplets will generally be used, with the number of layers of deposited droplets depending on the designed effective thermal conductance. The substrate surface can be prepared prior to printing to enable uniform adhesion of the nanoparticle-bearing ink to the substrate surface.

An inkjet printer that deposits larger droplets enables use of larger metallic nanoparticles 402. Small (4 to 150 nm) metallic nanoparticles 402 can result in metallic nanoparticles 402 overlapping or clumping. Larger metallic nanoparticles 402 reduce overlapping and clumping, which enables fabrication of a graphene sheet 512 (FIG. 5B) with fewer grain boundaries in the graphene sheet 512 after sintering. (The graphene sheet 512 is also called a graphene layer herein.) Grain boundaries cause electron scattering. Fewer grain boundaries results in improved thermal conductivity. Generally, sintering results in some amount of inclusions, such as voids and carbon that does not exit a formed metal layer to form the graphene sheet 512 (as further described below). Fewer inclusions correlates to higher thermal conductance. Accordingly, the sintering process can be designed to reduce inclusions.

FIG. 5B shows an example view 508 of a wafer 502 after sintering of a layer of metallic nanoparticles 402 to form a thermally conductive back side 504 layer. After the metallic nanoparticles 402 are deposited (FIG. 5A), they are sintered at a temperature of, for example, less than 400 degrees C. (Celcius), generally 250 degrees C. to 300 degrees C. The temperature limitation relates to the circuits previously fabricated on the front side 506 of the wafer 502. Temperatures over 400 degrees C. may damage the circuits.

A heating apparatus, such as an oven (not shown), sinters (heats) the metallic nanoparticles 402 to melt them. As the melted metal cools, the carbon from carbon-containing nanoparticles 402 rises from the flowing metal to the metal's surface. The carbon restructures, seeding on the hexagonally structured, cooling surface of the metal to form a graphene sheet 512. Accordingly, the carbon rising out of the metal rearranges to match the hexagonal surface structure of the solidifying metal, which means the carbon forms graphene. The graphene sheet 512 can be, for example, a few monolayers (atomic layers) thick. FIG. 5B also shows the melted metallic nanoparticles 510. The melted metallic nanoparticles 510 are shown as a uniform sheet, though top and bottom surfaces can be, to some extent, rough, reflecting the sintered nanoparticle origin of the layer corresponding to the melted metallic nanoparticles 510. As described above with respect to FIG. 4A, the graphene sheet 512 is highly conductive, enabling a thinner thermally conductive backside 504 layer, which tends to result in decreased wafer 502 warpage. Accordingly, a thinner thermally conductive backside 504 layer reduces stress on and related warpage of the wafer 502. For example, a backside 504 layer of a few microns in thickness or less can avoid excessive stress on the wafer 502. Sintering results in the melted metallic nanoparticles 510 being attached relative and proximate to the back surface 504 of the wafer 502. Accordingly, the melted metallic nanoparticles 510 become attached directly to the back surface 504 of the wafer 502, or to a layer overlying and directly or indirectly attached to the back surface 504 of the wafer 502. The graphene sheet 512 forms so that it is fixedly coupled (attached) to the layer of melted metallic nanoparticles 510.

Figure 6:
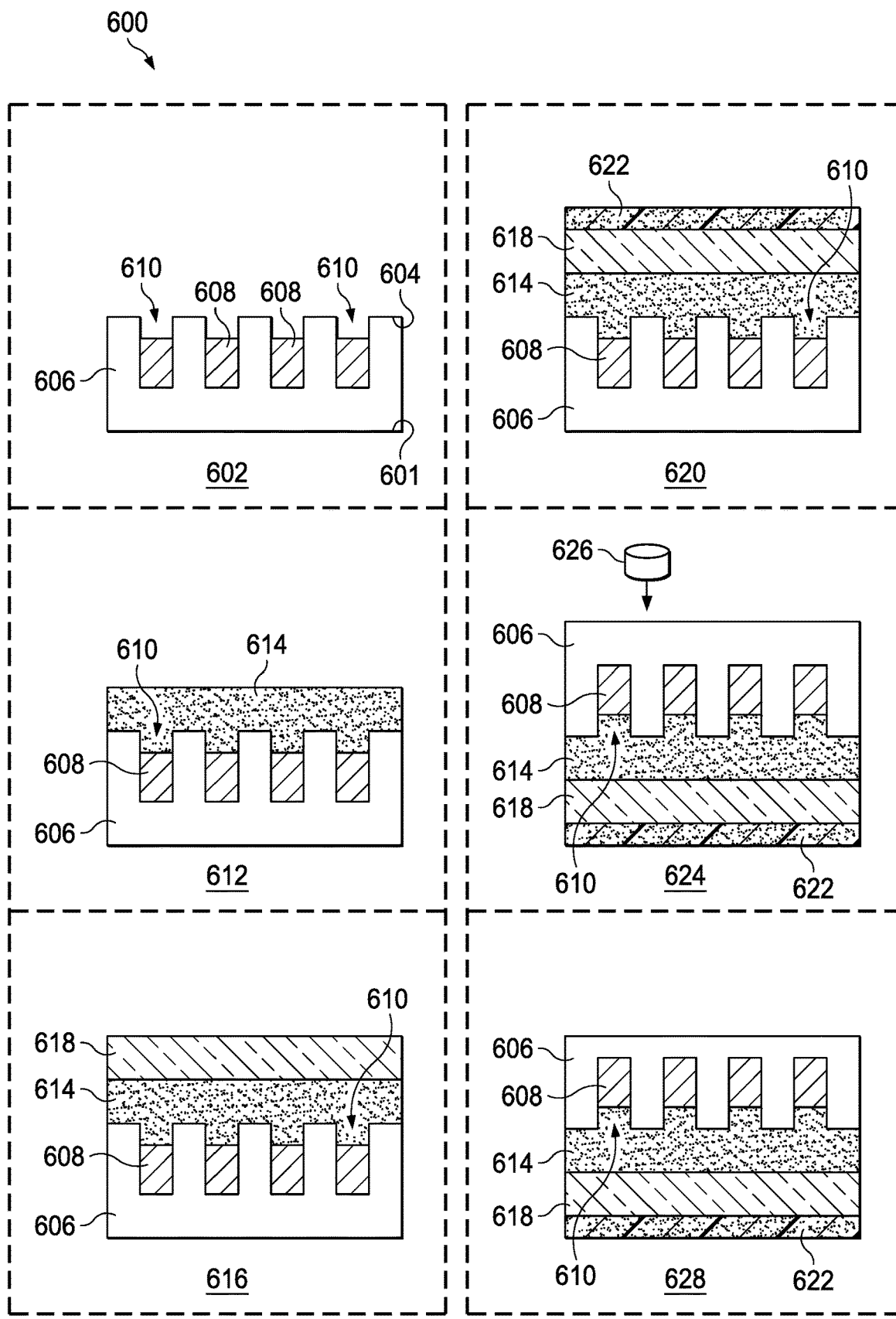
FIG. 6 shows an example process for fabricating a thermally conductive layer on a back surface of a wafer.
Figure 6:
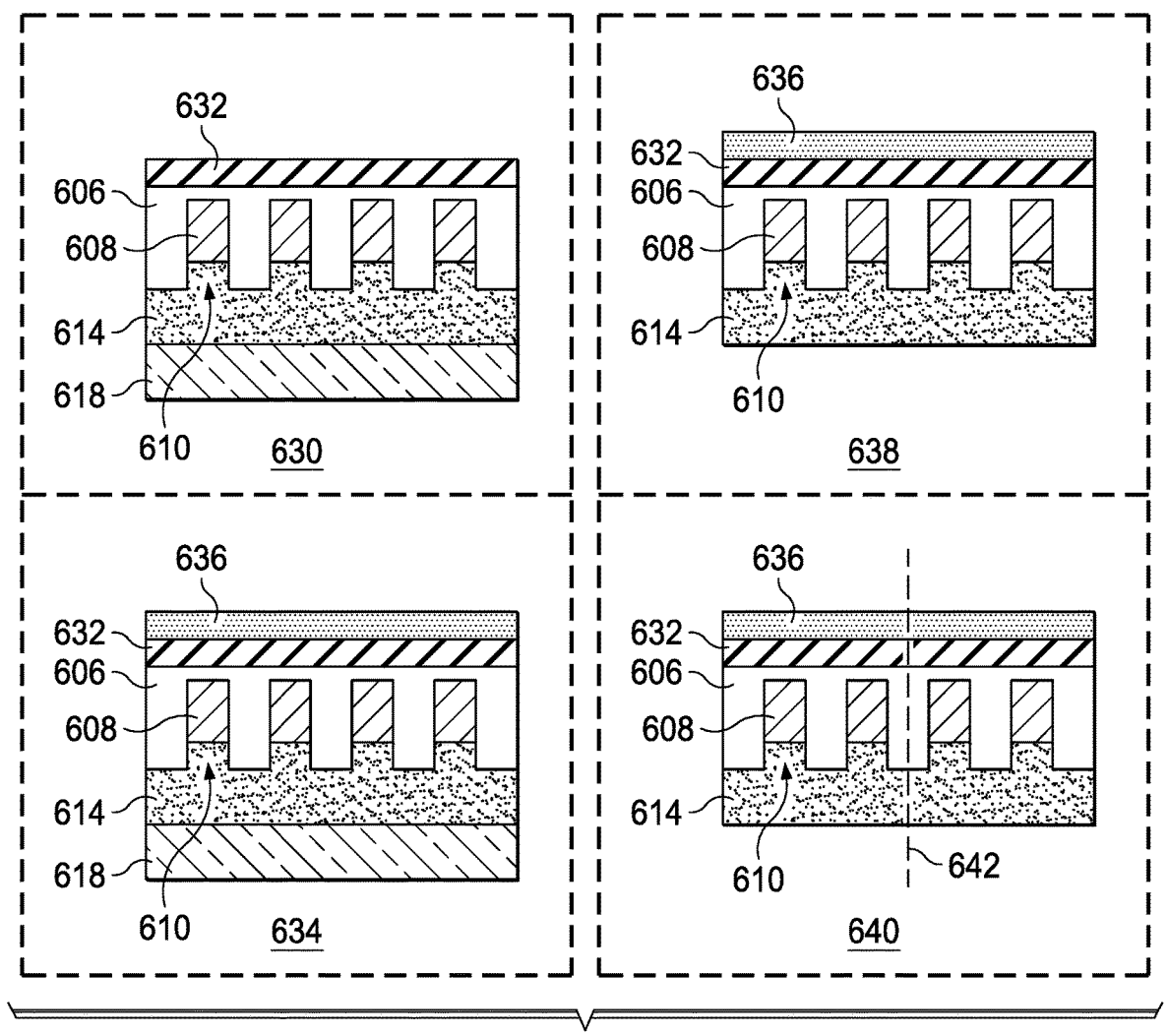

FIG. 6 shows an example process for fabricating a thermally conductive layer on a back surface 601 of a wafer 606. In step 602, a front surface 604 of the wafer 606 is patterned, so that pattern material 608 such as conductive metal or polysilicon fills trenches 610 previously created using etch processes (similarly to as described with respect to FIG. 3). In some examples, pattern material 608 is arranged (designed) to form circuitry. In step 612, adhesive 614 is applied to cover the front surface 604 of the wafer 606. In step 616, a glass carrier 618, which is useful as a safe handle for grabbing and manipulating the wafer 606, is stuck on to the adhesive 614. In step 620, double-sided grinding tape 622 is adhered to the glass carrier 618. In step 624, the wafer 606 is flipped over using the glass carrier 618, and the grinding tape 622 is adhered to a stable surface (not shown), thereby holding the wafer 606 in place. A grinder 626 is prepared to reduce the thickness of the wafer 606, from a first thickness (for example, 680 to 700 microns) down to a second thickness (for example, 50 microns). In step 628, the wafer's thickness is reduced by the grinder 626.

In step 630, the wafer 606, adhesive 614, and glass carrier 618 are removed from the grinding tape 622 and the stable surface. Also, an $SiO_2$ layer 632 is added to the back side 601 of the wafer 606 in step 630. The $SiO_2$ layer 632 is useful to add to provide a dielectric layer, but is thin—for example, a few tenths of nm thick—to allow effective function of a subsequently-added thermally conductive layer (the graphene layer 636). In step 634, an inkjet printer deposits metallic nanoparticles, some of which include carbon particles, onto the back side 601 of the wafer 606 (accordingly, as shown in FIG. 6, onto the $SiO_2$ layer 632), and the metallic nanoparticles are sintered to form a metallic layer (shown as melted metallic nanoparticles 510, FIG. 5B) and then cooled so that a graphene layer 636 forms on a surface of the metallic layer. In step 638 the glass carrier 618 is removed. In step 640, the wafer 606 is cut 642 into separate dies.

Figure 3:
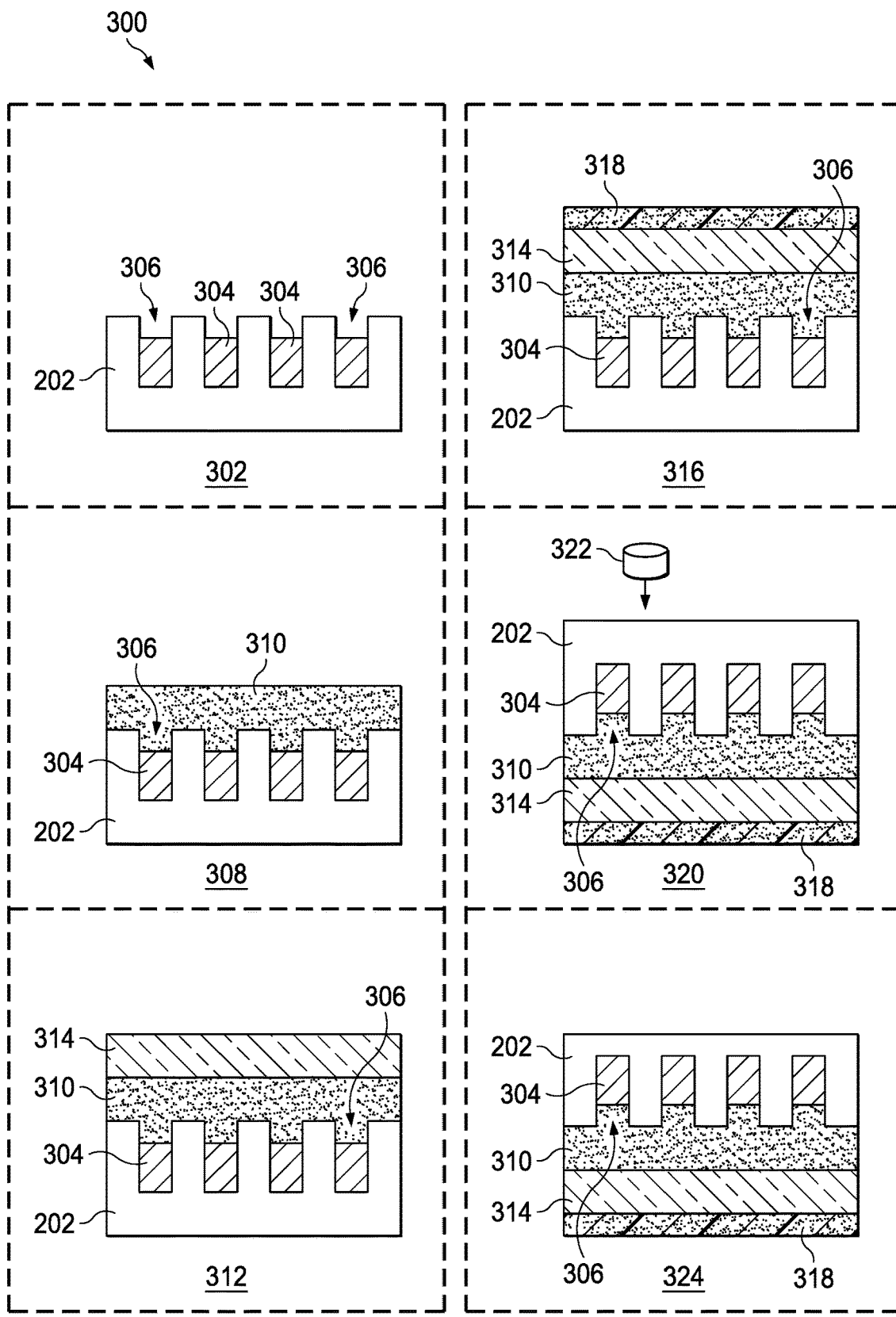
FIG. 3 (prior art) shows a process for fabricating a back side metal layer on a back surface of the FIG. 2 wafer.
Figure 3:
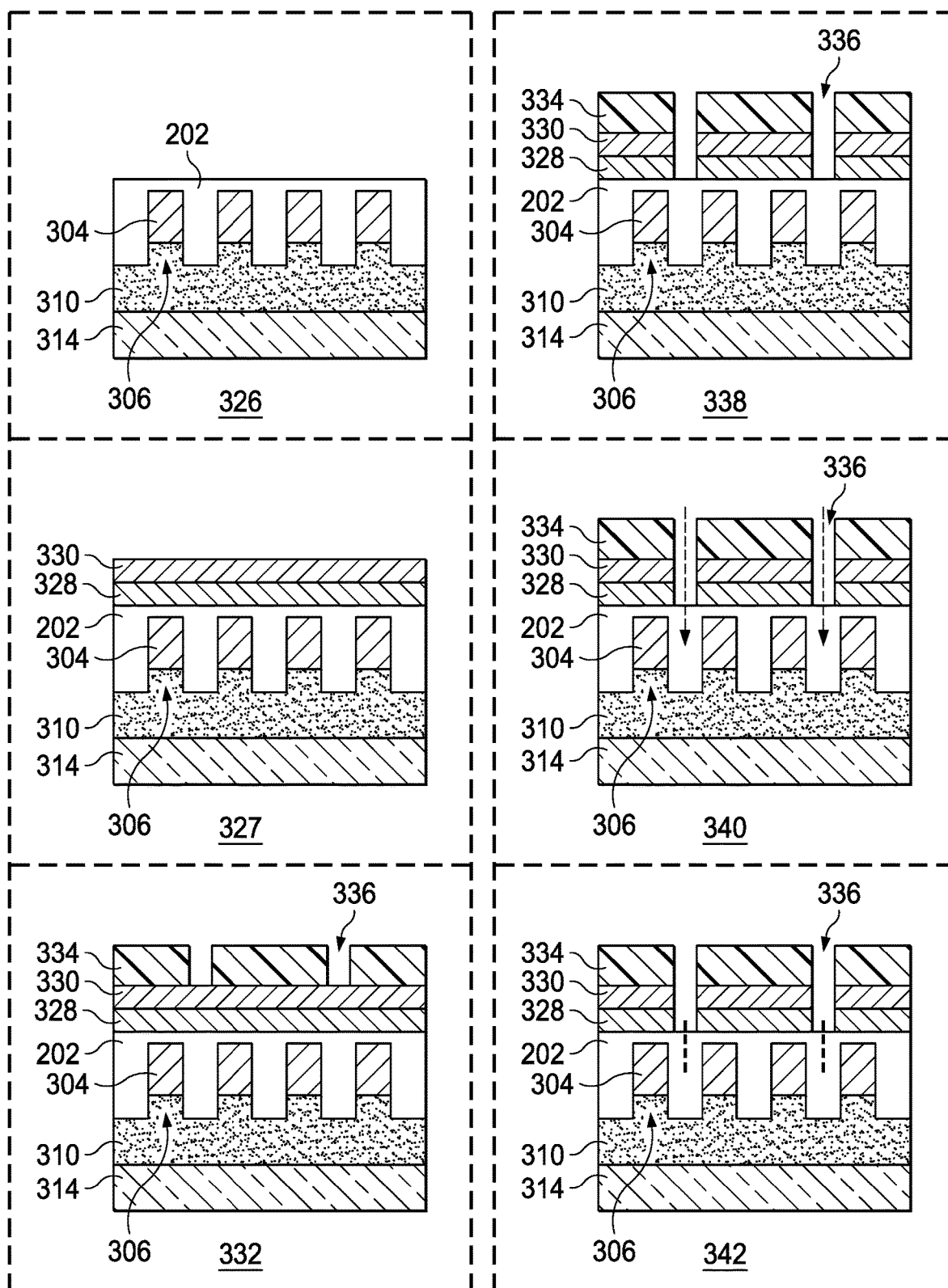
Figure 3:
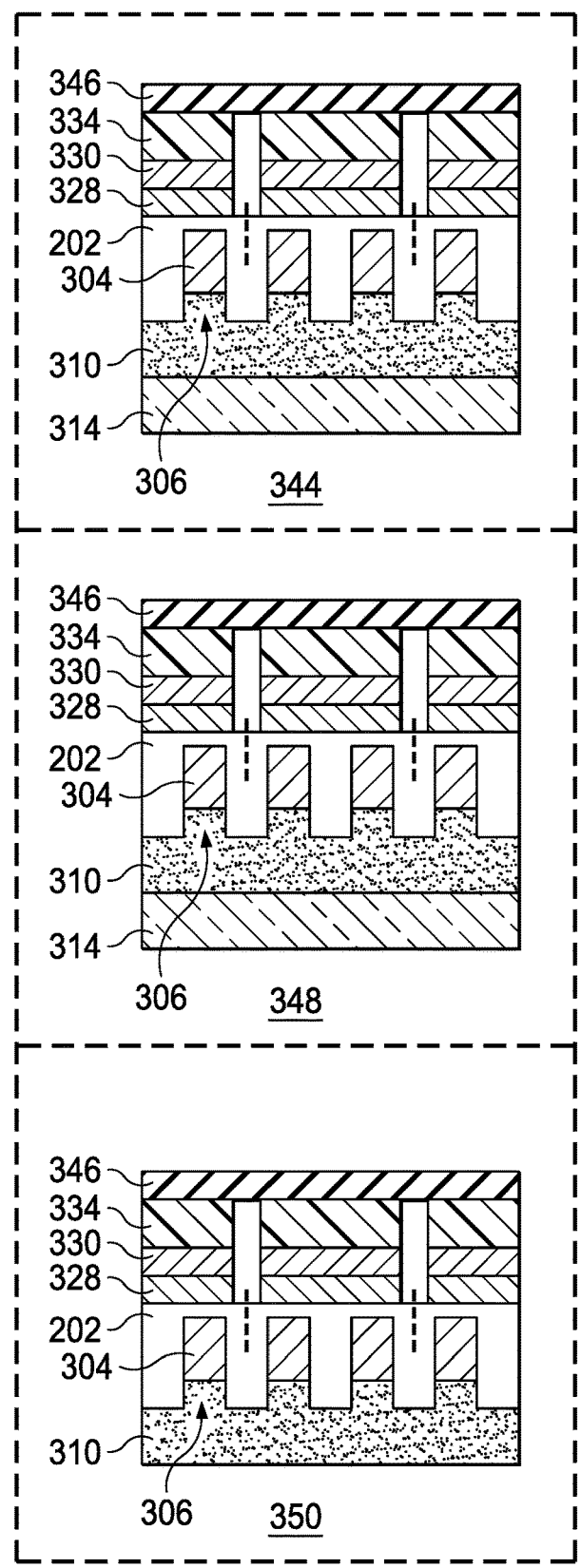

As is apparent from comparison of FIGS. 3 and 6, selective inkjet deposition of graphene sheet back layers enables reduction in the number of steps in a die fabrication process which includes creation of a thermally conductive back side layer. For example, the number of steps can be reduced by depositing the graphene sheet and metallic back layers so that they do not cover dicing locations.

Figure 7:
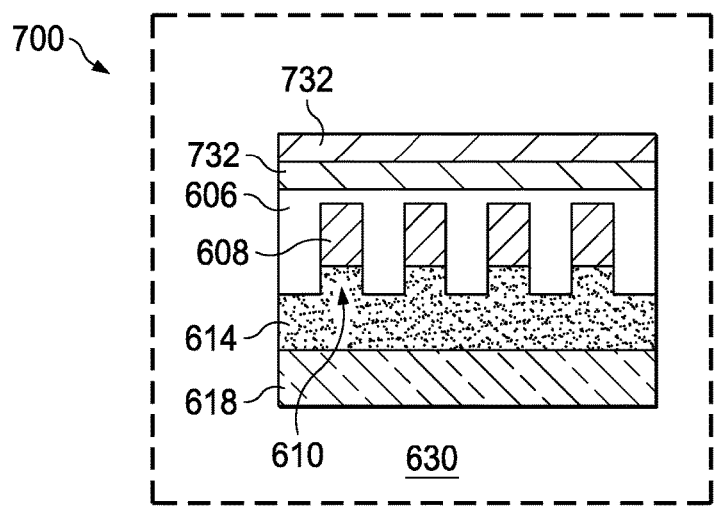
FIG. 7 shows an alternative embodiment of step 630 of FIG. 6, in which one or more metal layers, such as a layer of TiW and a layer of Cu, is added to the back side of the wafer.

FIG. 7 shows an alternative embodiment of step 630 of FIG. 6, in which one or more metal layers 732, such as a layer of TiW and a layer of Cu, is added to the back side 601 of the wafer 606.

In some embodiments, spin coating is used to apply nanoparticles to a substrate surface.

In some embodiments, different portions of the back side of the wafer are covered by the metallic layer and the graphene layer. In some embodiments, substantially all of the back side of the wafer is covered by the metallic layer and the graphene layer, the meaning of substantially all being determined by the portion of the back side of the wafer required to be covered to meet the design requirements for thermal spreading of the thermally conductive back side layer.

In some embodiments, a graphene sheet layer is fabricated on a front surface of the substrate. For example, a graphene sheet layer on a front surface of the substrate is useful for heat spreading. Such a graphene sheet layer can, for example, be fabricated close to an integrated circuit or other functional device or other heat source.

In some embodiments, a graphene sheet layer is fabricated on only a portion of a front or back surface of a substrate. In some embodiments, a graphene sheet layer is fabricated on a front surface of a substrate, except a portion of the front surface covered by a functional device such as an integrated circuit.

In some embodiments, a filter is used in arc processes to produce particles for deposition.

In some embodiments, the metallic portion of the nanoparticles is formed by an alloy of multiple transition metals.

Modifications are possible in the described embodiments, and other embodiments are possible, within the scope of the claims.

What is claimed is:
1. An integrated circuit, comprising:
   a semiconductor substrate having opposite first and second surfaces, the first surface having a patterned region;
   circuitry in the patterned region of the first surface;
   a metallic layer on the second surface; and
   a carbon layer on the metallic layer.
2. The integrated circuits of claim 1, wherein the metallic layer includes a transition metal, the transition metal including at least one of: silver, nickel, ruthenium, cobalt, molybdenum, or iridium.

3. The integrated circuits of claim 1, wherein the carbon layer includes interior grain boundaries.

4. The integrated circuit of claim 1, wherein the metallic layer includes a layer of metallic nanoparticles and carbon particles.

5. The integrated circuit of claim 4, wherein the metallic nanoparticles are between 4 mn and 150 mn in diameter.

6. The integrated circuit of claim 1, wherein the carbon layer includes a graphene layer.

7. The integrated circuit of claim 1, wherein the carbon layer includes less than ten atomic layers.

8. The integrated circuit of claim 1, further comprising a dielectric layer between the second surface and the metallic layer.

9. The integrated circuit of claim 8, wherein a thickness of the dielectric layer is less than one nanometer.

10. An integrated circuit, comprising:
a semiconductor substrate having opposite first and second surfaces, the first surface having a patterned region;
circuitry in the patterned region of the first surface; and
a layer of metallic nanoparticles and carbon particles on the second surface.

11. The integrated circuits of claim 10, wherein the metallic nanoparticles include a transition metal, the transition metal including at least one of: silver, nickel, ruthenium, cobalt, molybdenum, or iridium.

12. The integrated circuit of claim 10, wherein the metallic nanoparticles are between 4 nm and 150 nm in diameter.

13. The integrated circuit of claim 10, further comprising a carbon layer on the layer of metallic nanoparticles and carbon particles.

14. The integrated circuit of claim 13, wherein the carbon layer includes a graphene layer.

15. The integrated circuit of claim 13, wherein the carbon layer includes less than ten atomic layers.

16. The integrated circuit of claim 10, further comprising a dielectric layer between the second surface and the layer of metallic nanoparticles and carbon particles.

17. The integrated circuit of claim 16, wherein a thickness of the dielectric layer is less than one nanometer.

* * * * *